US008765568B2

(12) United States Patent
Lukaitis et al.

(10) Patent No.: US 8,765,568 B2
(45) Date of Patent: Jul. 1, 2014

(54) METHOD OF FABRICATING THERMALLY CONTROLLED REFRACTORY METAL RESISTOR

(71) Applicant: International Business Machines Corporation, Armonk, NY (US)

(72) Inventors: Joseph M. Lukaitis, Pleasant Valley, NY (US); Deborah M. Massey, Jericho, VT (US); Timothy D. Sullivan, Franklin Lakes, NJ (US); Ping-Chuan Wang, Hopewell Junction, NY (US); Kimball M. Watson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/048,629

(22) Filed: Oct. 8, 2013

(65) Prior Publication Data
US 2014/0038381 A1 Feb. 6, 2014

Related U.S. Application Data

(62) Division of application No. 12/962,722, filed on Dec. 8, 2010, now Pat. No. 8,592,947.

(51) Int. Cl.
*H01L 23/36* (2006.01)
(52) U.S. Cl.
USPC .................................. 438/384; 257/E23.109
(58) Field of Classification Search
CPC .................. H01L 29/405; H01L 29/66166
USPC .................................................. 257/E23.109
See application file for complete search history.

(56) References Cited

U.S. PATENT DOCUMENTS

| 5,849,623 | A | 12/1998 | Wojnarowski et al. |
| 6,535,398 | B1 | 3/2003 | Moresco |
| 6,607,962 | B2 | 8/2003 | Zekeriya et al. |
| 6,642,604 | B2 | 11/2003 | Yamaguchi |
| 7,148,554 | B2 | 12/2006 | Nah et al. |
| 7,166,913 | B2 | 1/2007 | Chinthakindi et al. |
| 7,403,094 | B2 | 7/2008 | Beach et al. |
| 7,528,048 | B2 | 5/2009 | Coolbaugh et al. |
| 7,772,081 | B2 | 8/2010 | Lin et al. |
| 2006/0231945 | A1 | 10/2006 | Chinthakindi et al. |
| 2007/0284662 | A1 | 12/2007 | Chinthakindi et al. |
| 2008/0102584 | A1 | 5/2008 | Kerr et al. |
| 2008/0277642 | A1 | 11/2008 | In T. Zandt et al. |

OTHER PUBLICATIONS

U.S. Appl. No. 12/962,722, Office Action Communication, Feb. 21, 2013, pp. 1-7.
U.S. Appl. No. 12/962,722, Office Action Communication, Apr. 12, 2013, pp. 1-11.
U.S. Appl. No. 12/962,722, Notice of Allowance Communication, Jul. 19, 2013, pp. 1-9.

*Primary Examiner* — Stephen W Smoot
(74) *Attorney, Agent, or Firm* — Gibb & Riley, LLC; Richard M. Kotulak, Esq.

(57) ABSTRACT

A structure and method of fabricating the structure includes a semiconductor substrate having a top surface defining a horizontal direction and a plurality of interconnect levels stacked from a lowermost level proximate the top surface of the semiconductor substrate to an uppermost level furthest from the top surface. Each of the interconnect levels include vertical metal conductors physically connected to one another in a vertical direction perpendicular to the horizontal direction. The vertical conductors in the lowermost level being physically connected to the top surface of the substrate, and the vertical conductors forming a heat sink connected to the semiconductor substrate. A resistor is included in a layer immediately above the uppermost level. The vertical conductors being aligned under a downward vertical resistor footprint of the resistor, and each interconnect level further include horizontal metal conductors positioned in the horizontal direction and being connected to the vertical conductors.

20 Claims, 7 Drawing Sheets

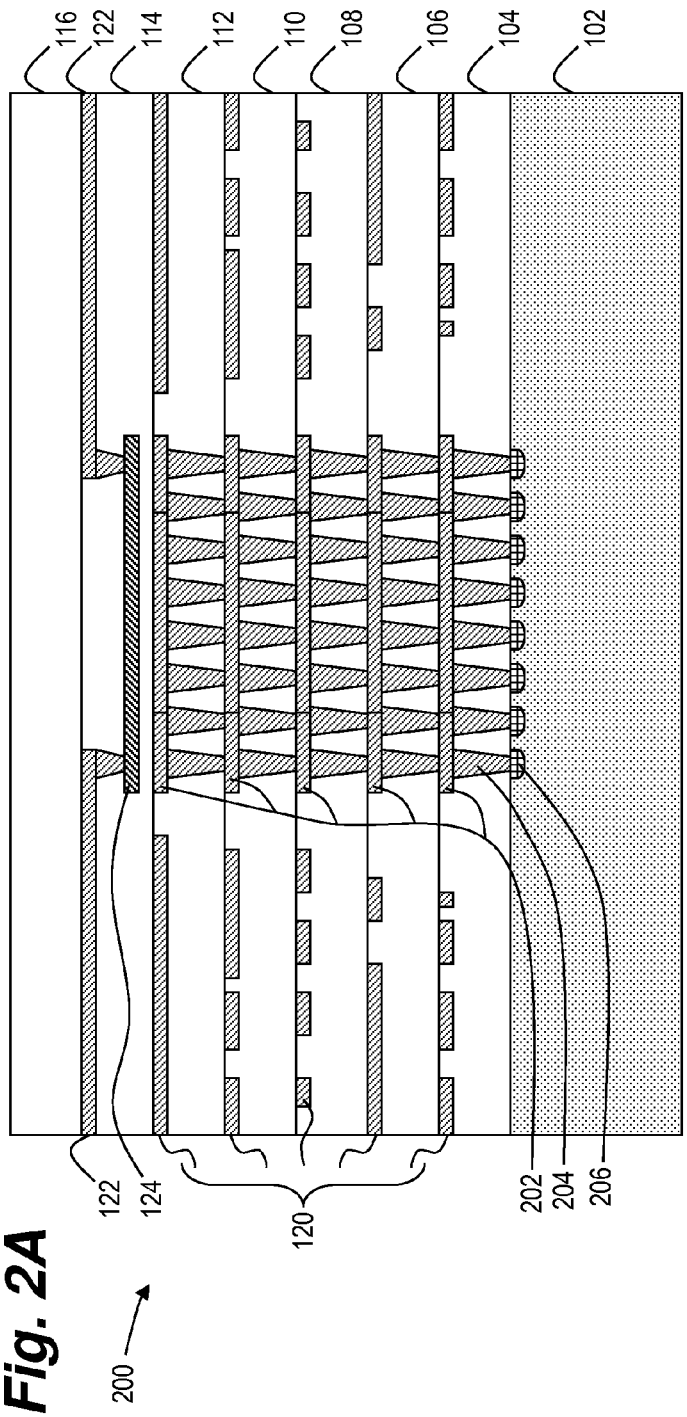
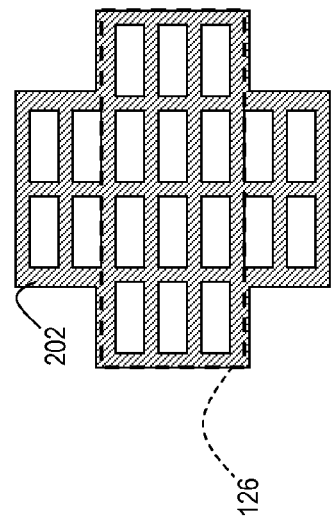
Fig. 2A
Fig. 2B

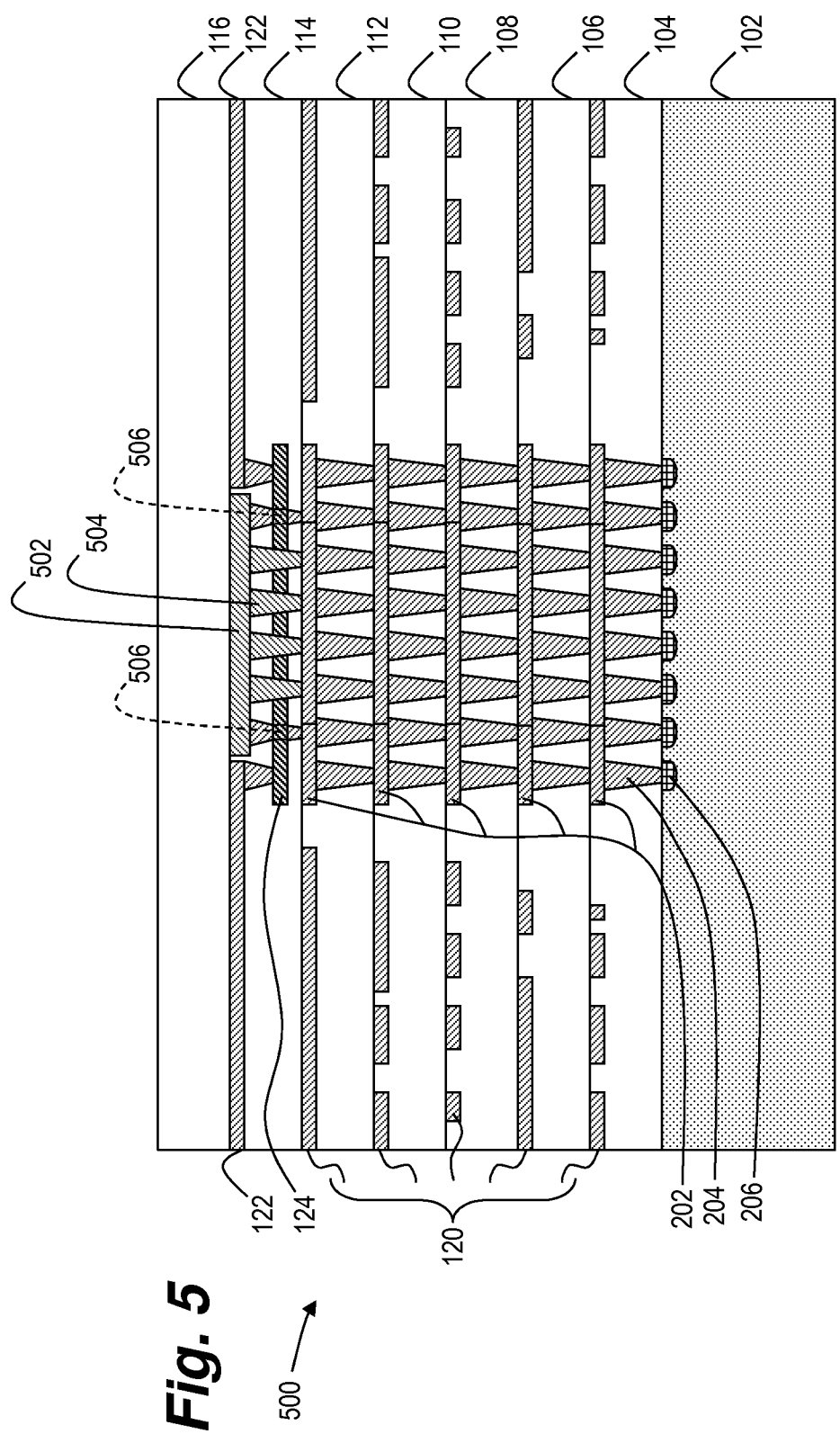

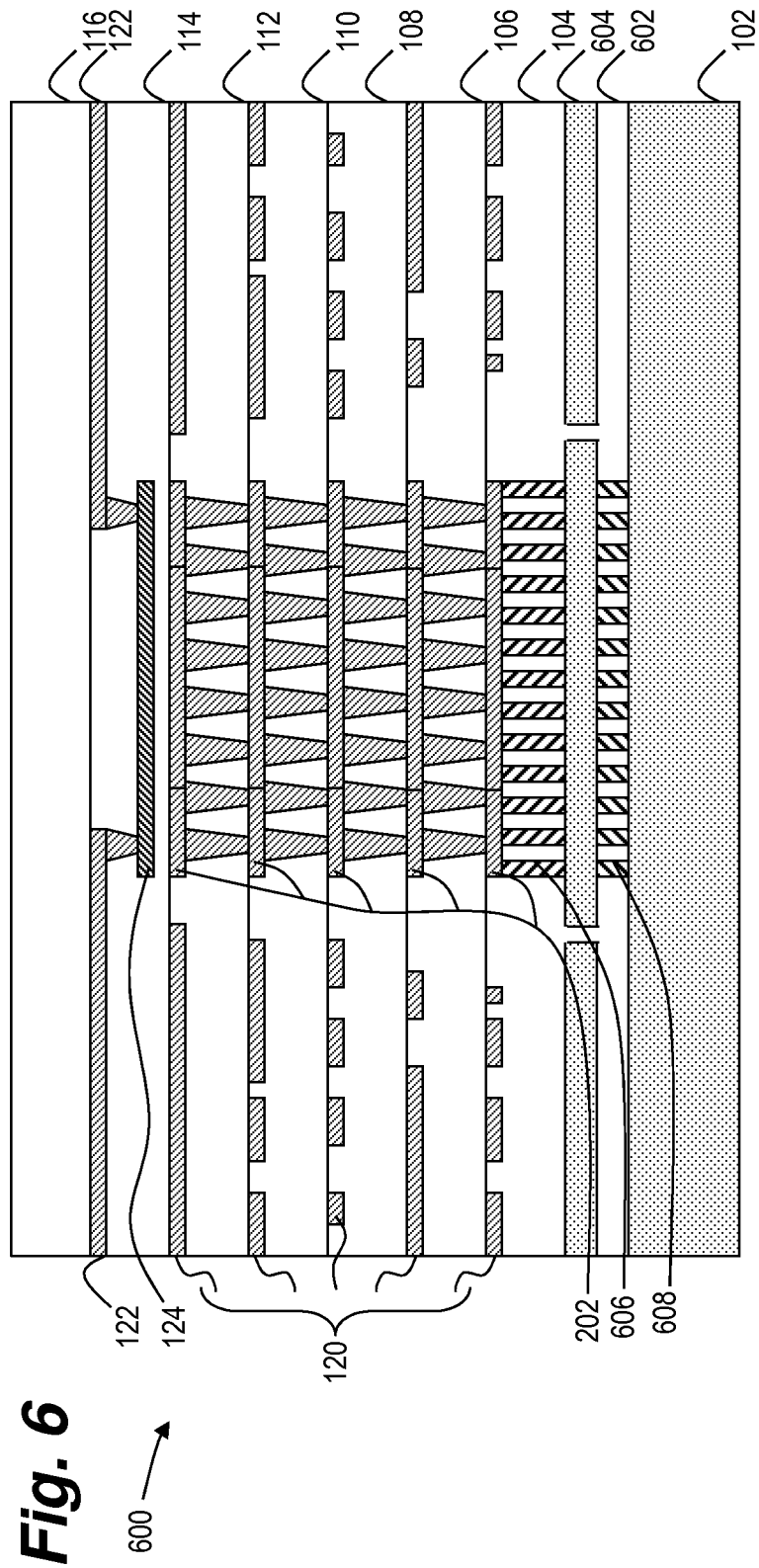

METHOD OF FABRICATING THERMALLY CONTROLLED REFRACTORY METAL RESISTOR

CROSS-REFERENCE TO RELATED APPLICATIONS

This application is a divisional of U.S. patent application Ser. No. 12/962,722, filed Dec. 8, 2010, now U.S. Pat. No. 8,592,947, the complete disclosure of which is incorporated herein by reference.

BACKGROUND

The present disclosure generally relates to limiting resistor heating in semiconductors by conducting heat to the semiconductor substrate by the insertion of multiple metal levels below the resistor, increasing the size of the inactive portion of the resistor, and capturing heat rising off the top of the resistor.

Thin-film resistors of several configurations are used in microelectronics circuits. Usually, these resistors are placed relatively close to the Si substrate, being made from diffusions, polysilicon, M1, and thin TaN, or other resistive film near M1. This placement has the advantage that heat can flow with relative ease to the Si through the relatively thin insulator layer upon which they are formed. Recently, there has been a demand for placing thin film resistors farther away from the substrate, for example, above four or five levels of metal. In this position, the insulator thickness below the resistor is much greater, and provides a substantial increase in thermal resistance, which materially affects the cooling rate of the resistor during operation.

In addition, the insulator layers themselves may be composed of low dielectric constant (low-k) or ultra-low dielectric constant (ULK) dielectrics, which often have a lower density and therefore a lower thermal conductivity than SiO2. The combination of increased thickness and decreased thermal conductivity cause the temperature of the resistor to be significantly greater for the same current than would be the case for the resistors fabricated near the Si substrate, and over conventional SiO2.

The temperature increase in the resistor has two deleterious effects: 1) damage to the resistor itself, and 2) enhanced electromigration damage in nearby metal lines that become hotter due to the resistor heating. For this reason, heating in the wiring levels is limited to 5 degrees C. (which is, nonetheless, roughly equivalent to a 25% decrease in lifetime). Hence, a larger resistor width must be used to meet the required current for a given circuit, and for these upper level resistors, that width can require costly chip area. Thus, some method for controlling the temperature of the resistor is needed to make the required devices smaller.

FIGS. 1A and 1B illustrate a semiconductor 100 having an Si semiconductor substrate 102, an M1 dielectric layer 104, an M2 dielectric layer 106, an M3 dielectric layer 108, an M4 dielectric layer 110, an M5 dielectric layer 112, a resistor layer 114, and an upper layer 116. Circuit wire elements 120, (shown on both sides of the semiconductor 100) are positioned within the layers M1-M5, 104-112, respectively. Cu or Al wires 122 lead to a refractory metal based resistor 124 located in a layer 114 above the M5 layer 112. The refractory metal based resistor 124 may include a refractory metal nitride such as TaN. A top view of a vertical footprint 126 of the resistor 124 is illustrated in FIG. 1B.

Multiple insulator layers M1-M5 104-112, below the resistor 124, create a high thermal resistance. Heat flow, illustrated by dashed arrow lines in a vertical downward direction in the general area and designated by reference number 130A, is impeded and the resistor heats up with relatively small current. Heat also flows upwards, illustrated by reference number 130B, and heats lines routed above the resistor 124, and heat flows into the contacting Cu (or Al) lines 122 heating them as well.

Compared to any resistors located above M1, resistors located high in the stack must operate at reduced current or else they will cause earlier metallization failure by EM and/or resistor damage from the elevated temperature. Furthermore, if the dielectric layers are composed of low-k or ULK insulator, the thermal conductivity is only a fraction that of oxide, compounding the problem. Current restrictions caused by heating constraints require larger resistor size to allow the same amount of current as is used for resistors at lower levels.

SUMMARY

An exemplary aspect of the devices and methods herein comprises a structure including a semiconductor substrate having a top surface that defines a horizontal direction and a plurality of interconnect levels stacked from a lowermost level proximate the top surface of the semiconductor substrate to an uppermost level furthest from the top surface of the substrate. Each of the interconnect levels include vertical metal conductors physically connected to one another in a vertical direction perpendicular to the horizontal direction. The vertical conductors in the lowermost level are physically connected to the top surface of the substrate, and the vertical conductors forming a heat sink connected to the semiconductor substrate. A resistor is included in a layer immediately above the uppermost level. The vertical conductors is aligned under a downward vertical resistor footprint of the resistor, and each interconnect level further includes horizontal metal conductors positioned in the horizontal direction and being connected to the vertical conductors.

Another exemplary aspect of the devices and methods herein comprises a structure including a semiconductor substrate having a top surface that defines a horizontal direction and a plurality of interconnect levels stacked from a lowermost level proximate the top surface of the semiconductor substrate to an uppermost level furthest from the top surface of the substrate. Each of the interconnect levels include vertical metal conductors physically connected to one another in a vertical direction perpendicular to the horizontal direction. The vertical conductors in the lowermost level are physically connected to the top surface of the substrate, and the vertical conductors form a heat sink connected to the semiconductor substrate. A resistor is included in a layer immediately above the uppermost level. The vertical conductors are aligned under a downward vertical resistor footprint of the resistor, and each interconnect level further include horizontal metal conductors positioned in the horizontal direction and being connected to the vertical conductors. A heat shield is formed from a metal layer immediately above the resistor, where the heat shield substantially inhibits transmission of thermal radiation in an upward vertical direction from the resistor and is connected to the plurality of interconnect levels forming the heat sink immediately below the resistor.

Another exemplary aspect of a method of fabricating a semiconductor structure includes providing a semiconductor substrate having a top surface that defines a horizontal direction, and stacking a plurality of interconnect levels on the top surface of the semiconductor substrate to form a heat sink. The stacking further includes forming vertical metal conductors and horizontal metal conductors in each of the interconnect levels. A resistor is provided in a layer immediately above an uppermost level of the plurality of interconnect levels such that a downward vertical resistor footprint of the resistor is substantially aligned over the plurality of interconnect levels.

Another exemplary aspect of a method of fabricating a semiconductor structure includes providing a semiconductor substrate having a top surface that defines a horizontal direction, and stacking a plurality of interconnect levels on the top surface of the semiconductor substrate to form a heat sink. The stacking further includes forming vertical metal conductors and horizontal metal conductors in each of the interconnect levels. A resistor is provided in a layer immediately above an uppermost level of the plurality of interconnect levels such that a downward vertical resistor footprint of the resistor is substantially aligned over the plurality of interconnect levels. A heat shield is provided immediately above and electrically isolated from the resistor that substantially inhibits thermal radiation in an upward vertical direction from the resistor.

With these novel features, the devices and methods herein may effectively limit resistor driven temperature increase in semiconductors by conducting heat to the Si semiconductor substrate by the insertion of multiple metal levels below the resistor, increasing the size of the inactive portion of the resistor, and capturing heat rising off the top of the resistor.

BRIEF DESCRIPTION OF THE SEVERAL VIEWS OF THE DRAWINGS

The foregoing and other exemplary purposes, aspects and advantages will be better understood from the following detailed description, with reference to the drawings, in which:

FIG. 2A illustrates cross section of a semiconductor circuit chip according to devices and methods herein;

FIG. 2B illustrates a top view of a resistor footprint and of metal conductors in the interconnect layers according to devices and methods herein;

FIG. 5 illustrates cross section of a semiconductor circuit chip according to devices and methods herein;

FIG. 6 illustrates cross section of a semiconductor circuit chip according to devices and methods herein.

DETAILED DESCRIPTION

Figure 1A:
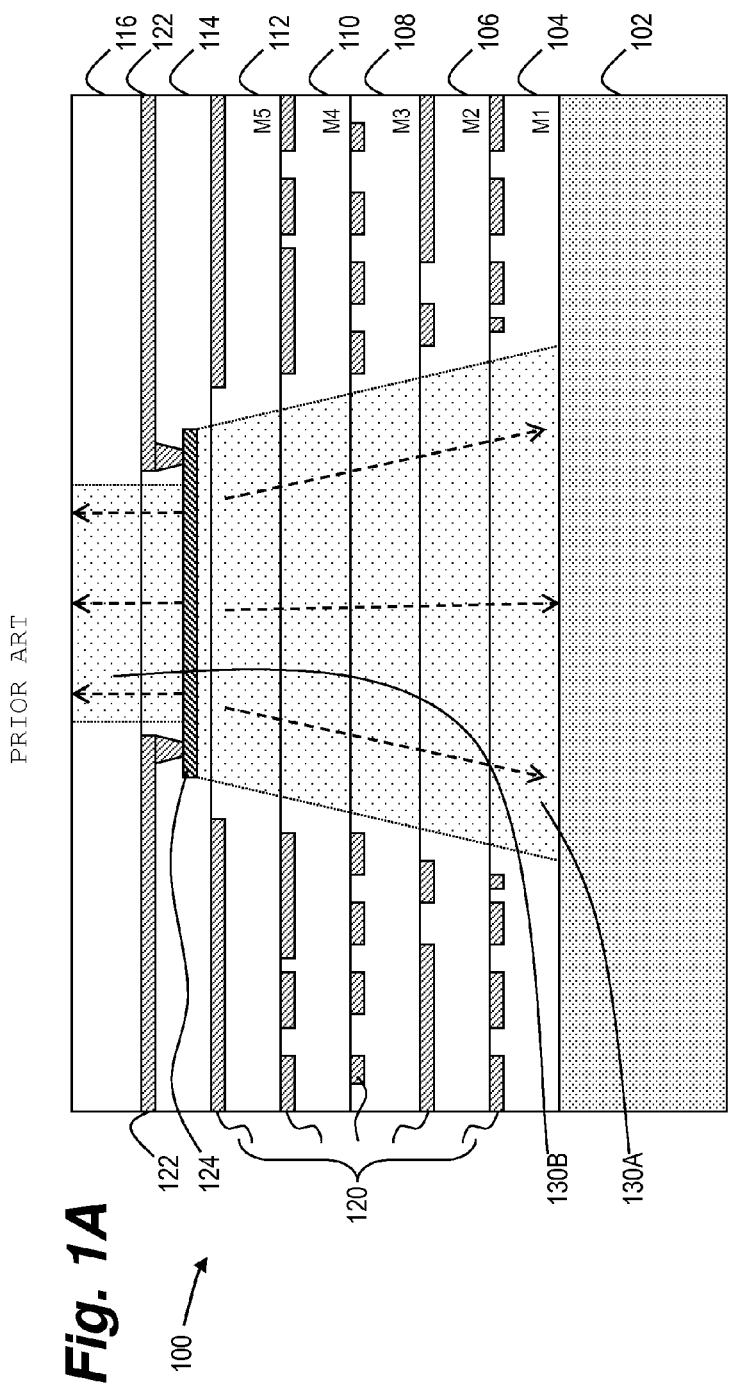
FIG. 1A illustrates cross section of a semiconductor circuit chip.
Figure 1B:
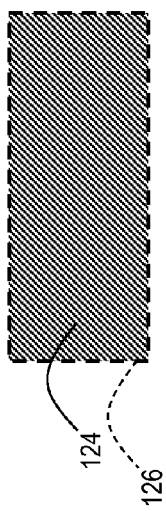
FIG. 1B illustrates a top view of a resistor.

Keeping the temperature of a resistor within the required 5° C. ensures the rate of heat conduction away from the resistor is equal to or greater than the rate of heat production within the resistor due to Joule heating. Since Joule heating is proportional to $I^2R=J^2\rho$, reduction of the current density is the most important parameter. However, for a given required current, the only way to decrease the current density is by increasing the cross-sectional area of the resistor, or in this case, since the film thicknesses are fixed, by increasing the width. Therefore, the only other option is to increase the heat flow away from the resistor by increasing the thermal conductance of the materials surrounding the resistor. Heat flows radially out from the resistor, but for thin, wide, and long resistors, most of the heat flows either up or down from the resistor. The nearest heat sink is the Si substrate, so most of the heat flows towards the substrate. However, a significant amount of heat flows upward as well, heating metal levels above the resistor, and some heat flows directly into the metal level that contacts the resistor electrically. (See FIG. 1A.) To keep the contacting metal within 5° C. above the chip temperature, the actual temperature of the resistor must also be limited to within 5° C.

The most direct approach to cooling is to place a stack of metal structures beneath the resistor extending from just under the resistor down to the Si substrate, (since the Si is the nearest heat sink). The topmost metal layer immediately below the resistor must not be in electrical contact with the resistor, but the vias on the bottom can contact the Si because the structure itself will not contact any other circuit components and will be electrically "floating." Plates on the order of the size of the resistor are connected together by a dense array of vias to create a continuous Cu structure extending through all the dielectric layers to the Si. Semiconductor 200 represented in FIGS. 2A and 2B is similar to FIG. 1A, and illustrates an array of parallel metal lines 202 or wires with the maximum number of vias 204 along each line placed within the resistor footprint 126 at each metal level M1-M5 104-112 below the resistor 124. Vias 204 contact to the Si substrate at reference number 206 ensuring a physical contact of the heat sink structure to the substrate 102.

Since the Si substrate 102 is the best nearby heat sink, cooling the resistor 124 requires creating a stack of Cu structures that reach from just under the resistor 124 down to the Si substrate 102. Cu has a thermal conductivity of about 400 W/(cm-K) compared to 1.0 W/(cm-K) for SiO2 and even less than that for low-k insulators. Since the metal/via stacked structure 202/204 is electrically isolated from surrounding circuitry, it can contact the Si substrate 102.

To estimate the effectiveness of this approach, one can compare the thermal resistance of the insulator stack to that of the Cu plus via stack. The following demonstrates that the thermal conductance of a layer containing the Cu plus the vias is about 155 times more thermally conductive than the insulator alone, assuming SiO2 as the insulator:

$$R_{\theta i} = \frac{1}{K_i}\frac{t_i}{lw} = \text{thermal resistance of one layer of insulator;}$$

$$R_{\theta Cul} = \frac{1}{K_{Cu}}\frac{t_m}{lw} = \text{thermal resistance of a layer of Cu; and,}$$

$$R_{\theta Cuv} = \frac{1}{K_{Cu}}\frac{t_v}{\left(\frac{lw}{5}\right)} = \text{thermal resistance of the via array.}$$

$$R_{\theta Cu} = \frac{1}{K_{Cu}}\frac{t_m}{lw} + \frac{1}{K_{Cu}}\frac{t_v}{\left(\frac{lw}{5}\right)} = \frac{1}{K_{Cu}}\frac{1}{lw}(t_m + 5t_v); \text{ then}$$

$$\frac{R_{\theta Cu}}{R_{\theta i}} = \frac{K_i}{K_{Cu}}\left(\frac{t_m + 5t_v}{t_m + t_v}\right), \text{ where } t_i = t_m + t_v,$$

$$\text{Then, } \frac{R_{\theta Cu}}{R_{\theta i}} = \frac{1}{400}\left(\frac{115 \text{ nm} + 5layers \times 75 \text{ nm}}{190 \text{ nm}}\right) = 0.0065,$$

-continued $$\text{or } \frac{G_{\theta Cu}}{G_{\theta i}} \cong 115.$$

These calculations assume the area of the via level to be 20% covered, and the thickness of the insulator level alone is equal to the thickness of the metal layer (115 nm) plus the thickness of the via layer (75 nm). These calculations also demonstrate that the metal/via stack is 115 times more effective at transporting heat away from the resistor for SiO2 than SiO2 alone. The thermal conductivity of the Cu plus via stack will be several times more effective in addition if the insulator is ULK, which has about 20% of the thermal conductivity of SiO2.

The following list is of several relevant film layer combinations and their corresponding thermal resistance: Mx oxide=19,000/tw; M1-M5 oxide=95,000/tw; Mx+Via Cu=122.5/tw; M1-M5 Cu=612.5/tw; Mx alone=28.75/tw; Vx alone=93.75/tw.

However, this may not determine the temperature of the resistor by itself, where other film thicknesses and sizes may be factors as well. There is also thermal resistance in series due to the thin layer of dielectric located between the bottom of the resistor and the next metal layer, as well as the thermal resistance to heat flowing up through the overlying oxide and out through the metal contacts. For purposes of temperature estimation, the heat flow along the resistor should be relatively small because the very thin refractory-metal-based film (~70 nm) provides too small of a cross section to allow much heat transport. That means that the cooling through the contacting wires will be restricted to the region around the contacts.

FIG. 2B demonstrates a top view of a metal conductor plate as a heat sink 202 where a metal plate with insulator fill shapes may be used to accommodate chemical mechanical polishing (CMP) requirements instead of an array of parallel lines as shown in FIG. 2A. In this configuration, an "outrigger" portion of the metal conductor projects outside of the resistor footprint 126 to enable more rapid lateral heat spreading in a second horizontal direction. This same "outrigger" configuration is illustrated in FIGS. 3B and 4B.

Figure 3A:
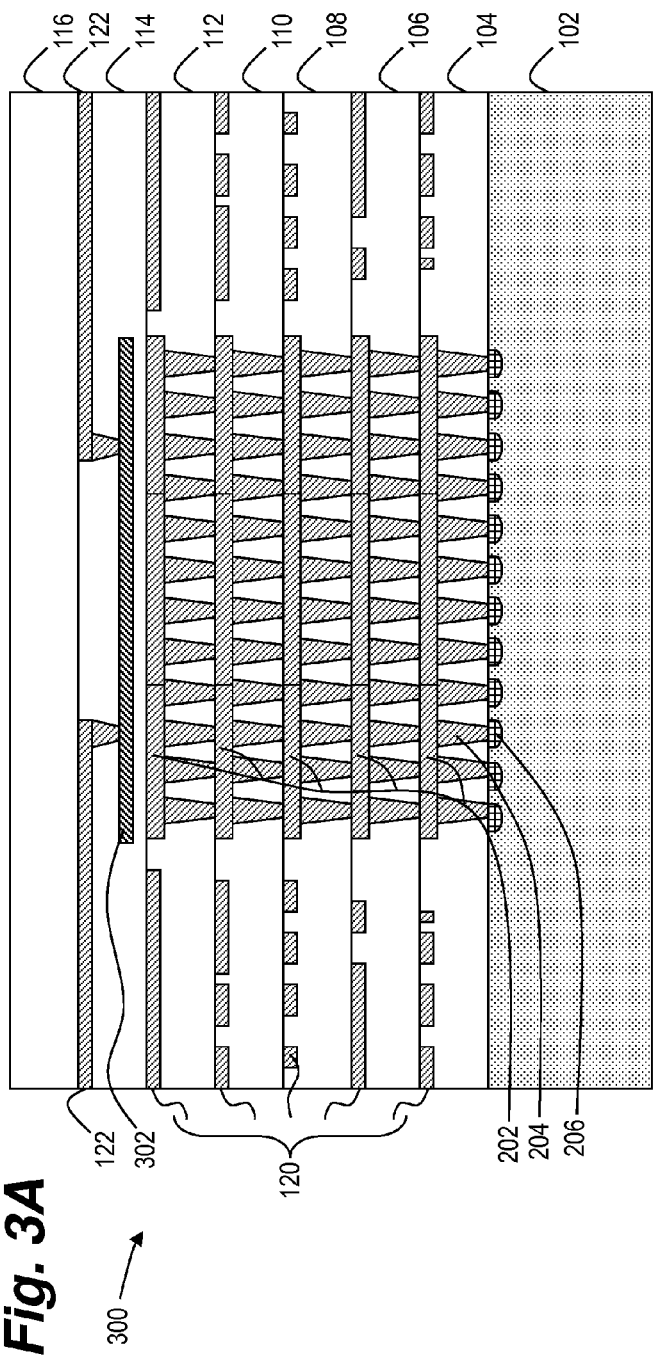
FIG. 3A illustrates cross section of a semiconductor circuit chip according to devices and methods herein.
Figure 3B:
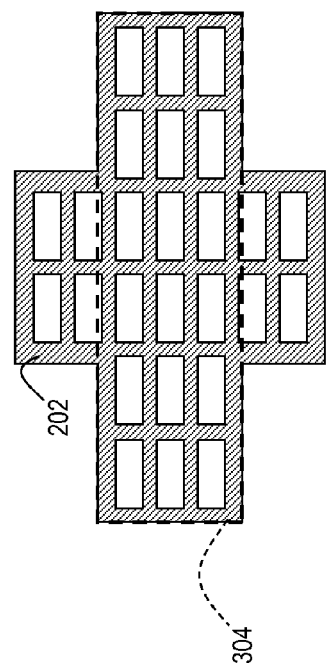
FIG. 3B illustrates a top view of a resistor footprint and of metal conductors in the interconnect layers according to devices and methods herein.

FIGS. 3A and 3B illustrate a semiconductor 300 where the resistor 302 can be horizontally extended beyond the vias connecting the resistor to metal layer 122, which enlarges the thermal footprint of the resistor without changing its resistance. For maximum heat transport effectiveness, the dimensions of the heat sink 202/204 that connect the proximate lower layer 112 to provide extra cooling area should be increased to match the resistor footprint. FIG. 3B illustrates the extended footprint 304 of the widened resistor 302 in relation to the metal conductor plate 202.

Figure 4A:
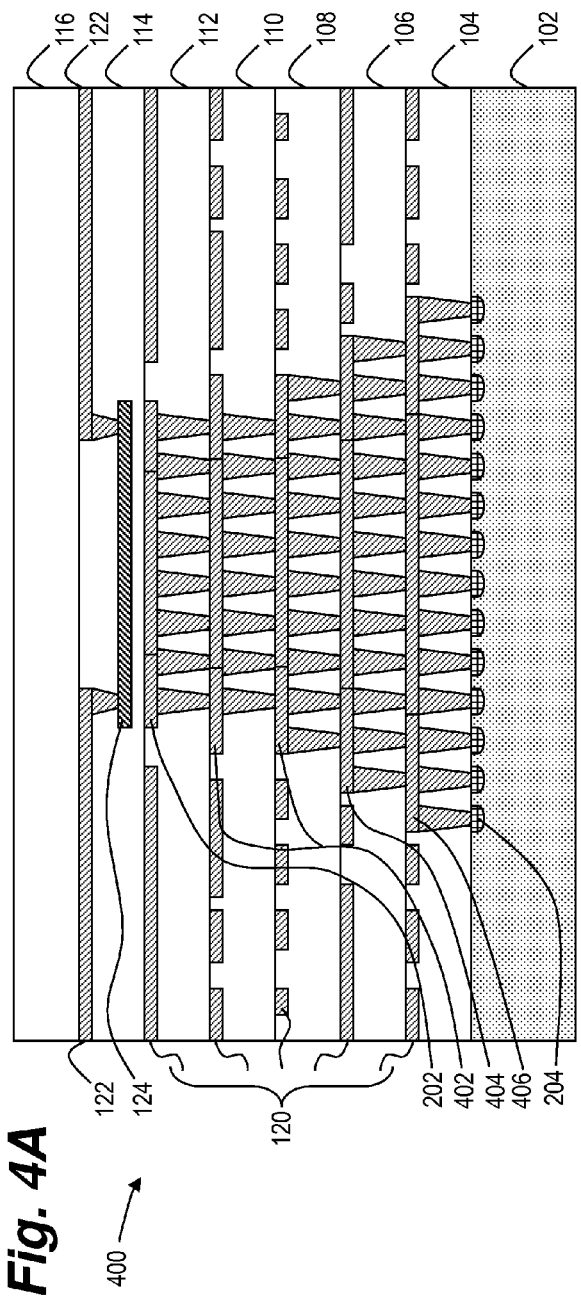
FIG. 4A illustrates cross section of a semiconductor circuit chip according to devices and methods herein.
Figure 4B:
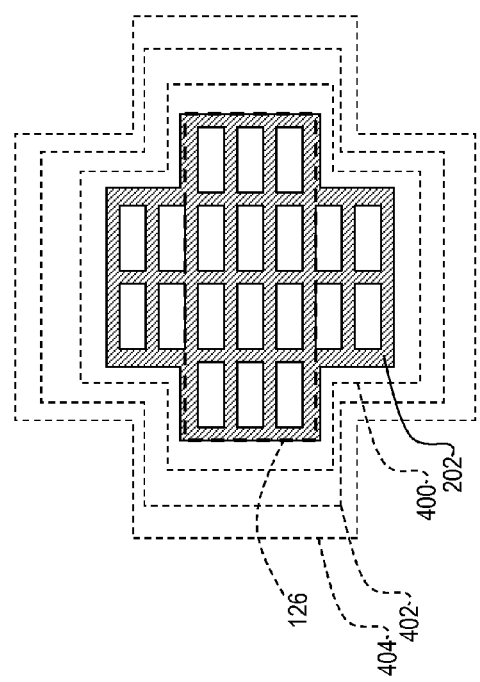
FIG. 4B illustrates a top view of a resistor footprint and of metal conductors in the interconnect layers according to devices and methods herein.

FIGS. 4A and 4B illustrate a semiconductor 400 where metal conductor plates 402, 404 and 406 may be made larger than the resistor footprint, and to increase in horizontal size in lower layers commensurate with the area of the thermal path (see 130A in FIG. 1A), as it approaches the substrate 102. This has the dual effect of increasing the thermal capacity of the stack and of decreasing the thermal resistance, enabling greater heat flow.

One or more of the plates 402, 404, and 406 can be made larger than plates in layers above them, making the larger lower plates having the greatest impact on the thermal resistance, since heat spreads much faster in Cu than in SiO2. Because of the high thermal conductivity of the Cu, heat will travel at least as far laterally as it does vertically as it flows down from the resistor. When the plates are made wider, the thermal footprint at the top of the Si becomes much larger, and this reduces the thermal resistance. The cost of this added thermal conductance is in wiring channels at the various metal levels, but there may be some situations where the cooling benefits outweigh the cost in loss of wiring area. If the resistor has a short wide shape, extending the resistor area to the outside of the contacts in an inactive area, (where no current is flowing through it), will increase the thermal footprint of the resistor on the metal below, and will increase the thermal conductance.

FIG. 5 illustrates a semiconductor 500 where the upper heat conduction path (130B as shown in FIG. 1A), may be blocked with an overlying metal heat shield 502 that is attached to the metal layer 202 under the resistor 124. Most of the heat will therefore be supplied by the central region of the resistor 124 far away from the contacts 122. Heat flowing upward can be captured by a metal layer 502 over the resistor, and then channeled downward to the stacked metal/via structure 504/506 to the substrate 102. The effectiveness of this path will depend mostly on thickness of the insulator between the top of the resistor film and the bottom of the overlying metal. Contacting vias 504 of the heat shield 502 may be formed around the resistor 124, i.e., outside of the resistor footprint 126 in a similar manner to the conductive metal plates having an "outrigger" portion outside the resistor footprint, (see FIGS. 2A and 2B), and connected to the underlying metal pad/wire 202. Additionally, when the resistor is large enough, and ground rules allow it, holes 506 can also be designed through the resistor 124 to allow heat shield vias 504 to reach down through the resistor 124 to the Cu metal conductor layer 202 in layer M5 112.

FIG. 6 illustrates a semiconductor 600 where in an event that the resistor 124 is on an SOI technology, special contacts 606/608, which penetrate through both the thin Si layer 604 and the buried oxide layer 602 and are electrically isolated form Si layer 604, can be used to enhance the thermal conductance. Multiple vias 606/608 extend through the buried oxide layer to provide a low-resistance thermal path to the Si substrate 102. Contacting vias, as well as the special contacts 606/608, may also be formed around the resistor 124, outside the resistor footprint 126, in a manner similar to the "outrigger" portion outside the resistor footprint (see FIGS. 2A and 2B), and connected to the underlying Si substrate 102.

Figure 7:
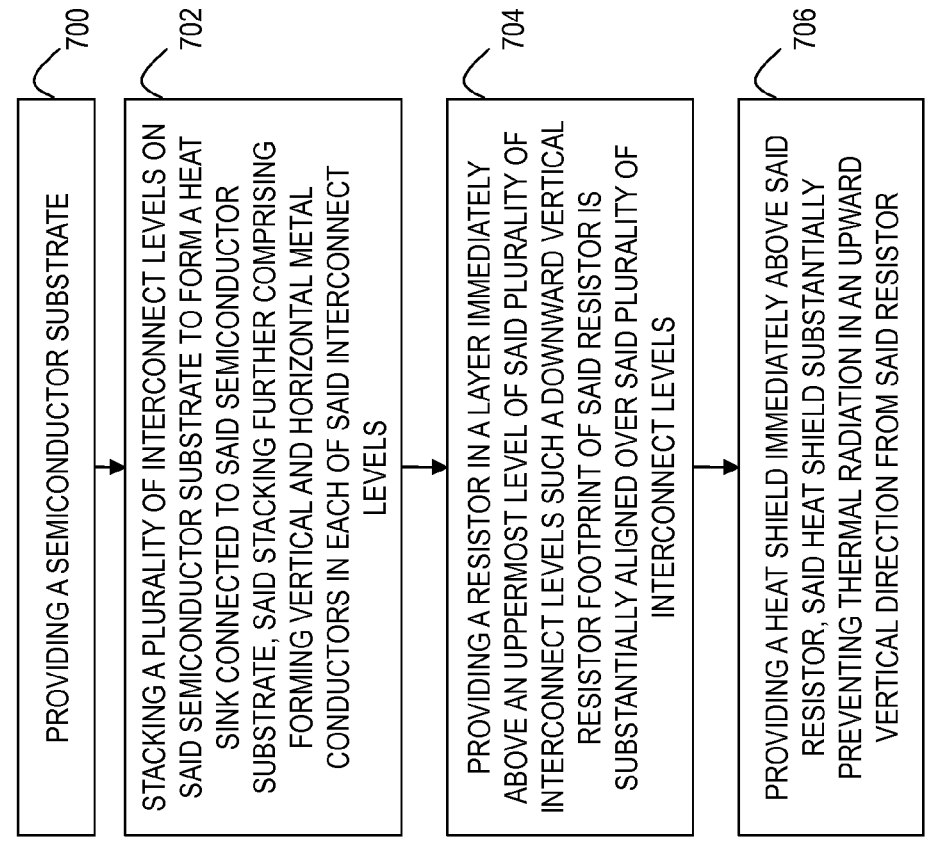
FIG. 7 illustrates a logic flowchart of a method of fabrication of a structure according to devices and methods herein.

FIG. 7 illustrates a method of fabrication for a semiconductor chip that includes providing a semiconductor substrate 700 having a top surface that defines a horizontal direction, and stacking a plurality of interconnect levels on the top surface of the semiconductor substrate to form a heat sink 702. The stacking further includes forming vertical metal conductors and horizontal metal conductors in each of the interconnect levels. A resistor is provided 704 in a layer immediately above an uppermost level of the plurality of interconnect levels such that a downward vertical resistor footprint of the resistor is substantially aligned over the plurality of interconnect levels. A heat shield is provided 706 immediately above the resistor that substantially prevents thermal radiation in an upward vertical direction from the resistor.

With its unique and novel features, the devices and methods herein provide effective limiting of resistor heating in semiconductor circuit chips by conducting heat to the Si substrate by the insertion of multiple metal levels below the resistor, increasing the size of the inactive portion of the resistor, and capturing heat rising off the top of the resistor.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular systems and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The description of the various devices and methods herein has been presented for purposes of illustration and description, but is not intended to be exhaustive or limited to the devices and methods disclosed. Many modifications and variations will be apparent to those of ordinary skill in the art without departing from the scope and spirit of the disclosure herein. The terminology used herein was chosen to best explain the principles of the devices and methods, the practical application or technical improvement over technologies found in the marketplace, or to enable others of ordinary skill in the art to understand the devices and methods discloses herein. Various modifications, as are suited to the particular use of the concepts disclosed, are contemplated.

What is claimed is:

1. A method of fabrication of a semiconductor structure, said method comprising:
   providing a semiconductor substrate having a top surface, said top surface defining a horizontal direction;
   stacking a plurality of interconnect levels on said top surface of said semiconductor substrate to form a heat sink, said stacking further comprising forming vertical metal conductors and horizontal metal conductors in each of said interconnect levels; and
   providing a resistor in a layer immediately above an uppermost level of said plurality of interconnect levels such that a downward vertical resistor footprint of said resistor is substantially aligned over said plurality of interconnect levels.

2. The method of fabrication of claim 1, said forming said vertical metal conductors and said horizontal metal conductors in each of said interconnect levels further comprising:
   aligning an array of integrally formed parallel wires and vias.

3. The method of fabrication of claim 2, said forming said vertical metal conductors and said horizontal metal conductors in each of said interconnect levels further comprising:
   vertically aligning each of said vias in a vertical direction with other vias of adjacent levels.

4. The method of fabrication of claim 1, said forming said vertical metal conductors and said horizontal metal conductors in each of said interconnect levels further comprising:
   aligning a horizontal two-dimensional array including a metal plate having fill shape vias.

5. The method of fabrication of claim 4, said forming said vertical metal conductors and said horizontal metal conductors in each of said interconnect levels further comprising:
   vertically aligning each of said fill shape vias in a vertical direction with other fill shape vias of adjacent levels.

6. The method of fabrication of claim 1, said forming said vertical metal conductors and said horizontal metal conductors in each of said interconnect levels further comprising:
   aligning said vertical metal conductors and said horizontal metal conductors completely inside said downward vertical resistor footprint of said resistor.

7. The method of fabrication of claim 1, said forming said vertical metal conductors and said horizontal metal conductors in each of said interconnect levels further comprising:
   aligning said vertical metal conductors and said horizontal metal conductors outside said downward vertical resistor footprint of said resistor by progressively increasing the lateral width of said vertical metal conductors and said horizontal metal conductors from an uppermost level of said plurality of interconnect levels to a lowermost level of said plurality of interconnect levels, said lowermost level being proximate said semiconductor substrate.

8. A method of fabricating a semiconductor structure, said method comprising:
   providing a semiconductor substrate having a top surface, said top surface defining a horizontal direction;
   stacking a plurality of interconnect levels on said top surface of said semiconductor substrate to form a heat sink, said stacking further comprising forming vertical metal conductors and horizontal metal conductors in each of said interconnect levels;
   providing a resistor in a layer immediately above an uppermost level of said plurality of interconnect levels such that a downward vertical resistor footprint of said resistor is substantially aligned over said plurality of interconnect levels; and
   providing a heat shield immediately above and electrically isolated from said resistor, said heat shield substantially inhibiting thermal radiation in an upward vertical direction from said resistor.

9. The method of claim 8, said forming said vertical metal conductors and said horizontal metal conductors in each of said interconnect levels further comprising:
   aligning an array of integrally formed parallel wires and vias.

10. The method of claim 9, said forming said vertical metal conductors and said horizontal metal conductors in each of said interconnect levels further comprising:

vertically aligning each of said vias in a vertical direction with other vias of adjacent levels.

11. The method of claim 8, said forming said vertical metal conductors and said horizontal metal conductors in each of said interconnect levels further comprising:
aligning a horizontal two-dimensional array including a metal plate having fill shape vias.

12. The method of claim 11, said forming said vertical metal conductors and said horizontal metal conductors in each of said interconnect levels further comprising:
vertically aligning each of said fill shape vias in a vertical direction with other fill shape vias of adjacent levels.

13. The method of claim 8, said forming said vertical metal conductors and said horizontal metal conductors in each of said interconnect levels further comprising:
aligning said vertical and horizontal metal conductors completely inside said downward vertical resistor footprint of said resistor.

14. The method of claim 8, said forming said vertical metal conductors and said horizontal metal conductors in each of said interconnect levels further comprising:
aligning said vertical metal conductors and said horizontal metal conductors outside said downward vertical resistor footprint of said resistor by progressively increasing the lateral width of said vertical metal conductors and said horizontal metal conductors from an uppermost level of said plurality of interconnect levels to a lowermost level of said plurality of interconnect levels, said lowermost level being proximate said semiconductor substrate.

15. A method comprising:
providing a semiconductor substrate having a top surface, said top surface defining a horizontal direction;
stacking a first interconnect level on said top surface of said semiconductor substrate;
forming vertical metal conductors and horizontal metal conductors in said first interconnect level, said horizontal metal conductors contacting said vertical metal conductors and said vertical metal conductors contacting said semiconductor substrate;
stacking additional interconnect levels on top of said first interconnect level;
forming vertical metal conductors and horizontal metal conductors in each of said additional interconnect levels, said horizontal metal conductors contacting said vertical metal conductors and said vertical metal conductors contacting said horizontal metal conductors in a next lower interconnect level; and
forming a resistor in a layer immediately above an uppermost level of said additional interconnect levels, a downward vertical footprint of said resistor being substantially aligned over said vertical metal conductors and horizontal metal conductors in said interconnect levels.

16. The method of claim 15, further comprising:
forming a heat shield immediately above said resistor, said heat shield being electrically isolated from said resistor.

17. The method of claim 15, said forming vertical metal conductors and horizontal metal conductors further comprising one of:
aligning an array of integrally formed parallel wires and vias; and
aligning a horizontal two-dimensional array including a metal plate having fill shape vias.

18. The method of claim 17, said forming said vertical metal conductors and said horizontal metal conductors further comprising one of:
vertically aligning said vias in a vertical direction with other vias of adjacent levels; and
vertically aligning each of said fill shape vias in a vertical direction with other fill shape vias of adjacent levels.

19. The method of claim 15, said forming said vertical metal conductors and said horizontal metal conductors further comprising:
aligning said vertical metal conductors and horizontal metal conductors completely inside said downward vertical footprint of said resistor.

20. The method of claim 15, said forming said vertical metal conductors and said horizontal metal conductors further comprising:
aligning said vertical metal conductors and said horizontal metal conductors outside said downward vertical footprint of said resistor by progressively increasing the lateral width of said vertical metal conductors and said horizontal metal conductors from an uppermost level of said interconnect levels to a lowermost level of said interconnect levels, said lowermost level being proximate said semiconductor substrate.

* * * * *